US010325807B2

(12) United States Patent
Samra et al.

(10) Patent No.: US 10,325,807 B2
(45) Date of Patent: Jun. 18, 2019

(54) SEMICONDUCTOR DEVICE AND METHOD FOR MANUFACTURING THE SAME

(71) Applicant: Taiwan Semiconductor Manufacturing Co., Ltd., Hsin-Chu (TW)

(72) Inventors: Nick Samra, San Jose, CA (US); Stefan Rusu, Sunnyvale, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/488,910

(22) Filed: Apr. 17, 2017

(65) Prior Publication Data

US 2018/0166568 A1    Jun. 14, 2018

Related U.S. Application Data

(60) Provisional application No. 62/434,194, filed on Dec. 14, 2016.

(51) Int. Cl.
| | |
|---|---|
| *H01L 23/528* | (2006.01) |
| *H01L 23/522* | (2006.01) |
| *H01L 21/768* | (2006.01) |
| *H01L 23/535* | (2006.01) |
| *H01L 29/78* | (2006.01) |

(52) U.S. Cl.
CPC .... *H01L 21/76897* (2013.01); *H01L 21/7685* (2013.01); *H01L 21/76879* (2013.01); *H01L 23/528* (2013.01); *H01L 23/5226* (2013.01); *H01L 23/535* (2013.01); *H01L 29/78* (2013.01)

(58) Field of Classification Search
CPC ......... H01L 21/76879; H01L 21/7685; H01L 21/76897; H01L 21/768; H01L 21/76805; H01L 21/76807; H01L 21/76877; H01L 23/5226; H01L 23/528; H01L 23/5286; H01L 23/498; H01L 23/538; H01L 29/7827; H01L 29/6666
See application file for complete search history.

(56) References Cited

U.S. PATENT DOCUMENTS

| | | | | |
|---|---|---|---|---|
| 4,840,923 A * | 6/1989 | Flagello | ............ | H01L 21/4846 148/DIG. 164 |
| 5,227,013 A * | 7/1993 | Kumar | .................. | H01L 21/486 216/18 |
| 5,786,630 A * | 7/1998 | Bhansali | ........... | H01L 23/49822 257/697 |
| 6,417,032 B1 * | 7/2002 | Liaw | .................. | H01L 27/1104 257/903 |
| 8,552,563 B2 * | 10/2013 | Law | ...................... | H01L 23/481 257/774 |

(Continued)

*Primary Examiner* — Galina G Yushina
(74) *Attorney, Agent, or Firm* — Duane Morris LLP

(57) ABSTRACT

A semiconductor device includes first, second, and third metallization layers, on top of one another, that are disposed above a substrate, wherein each of the first, second, and third metallization layer includes a respective metallization structure formed in a respective dielectric layer, wherein the second metallization layer is disposed between the first and third metallization layers; and a via tower structure that extends from the first metallization layer to the third metallization layer so as to electrically couple at least part of the respective metallization structures of the first and third metallization layers.

16 Claims, 15 Drawing Sheets

(56) References Cited

U.S. PATENT DOCUMENTS

| | | | |
|---|---|---|---|
| 2004/0251549 A1* | 12/2004 | Huang | H01L 21/76804 |
| | | | 257/758 |
| 2005/0121793 A1* | 6/2005 | Liaw | H01L 23/50 |
| | | | 257/758 |
| 2007/0045851 A1* | 3/2007 | Kitada | H01L 23/53238 |
| | | | 257/758 |
| 2011/0001249 A1* | 1/2011 | Law | H01L 23/481 |
| | | | 257/776 |
| 2013/0087366 A1* | 4/2013 | Michael | H01L 23/50 |
| | | | 174/252 |

* cited by examiner

SEMICONDUCTOR DEVICE AND METHOD FOR MANUFACTURING THE SAME

CROSS-REFERENCE TO RELATED APPLICATION

The present application claims priority to U.S. Provisional Patent Application No. 62/434,194, filed on Dec. 14, 2016, which is incorporated by reference herein in its entirety.

BACKGROUND

Generally, in an integrated circuit (IC), one or more metallization layers disposed over active devices of the IC are used to route signal, power, and/or ground connections to their respective desired locations, and also interconnect respective coupled active device(s) in order to form functional circuitry. As the IC has grown more powerful and more complicated, various internal routing interconnections within the metallization layers have accordingly become more complicated. This has resulted in an increase in the number of metallization layers. However, such an increased number of metallization layers may in turn increase respective resistance value and power consumption of a routing interconnect structure for the use of signal transmission. This is typically due to each extra metallization layer's one or more corresponding vias that are used to electrically couple the metallization layer to one another. More particularly, an increased number of interfaces between respective vias and metallization layers contributes to the majority of increased resistance values of routing interconnect structures.

To address such issues, a variety of methods for forming routing interconnect structures have been proposed to decrease the resistance value of such structures. For example, two or more parallel vias can be disposed side by side (i.e., horizontally) to connect vertically neighboring metallization layers. Although the parallel vias may essentially decrease the overall resistance value of the routing interconnect structure, such additional vias may require relocation of real estate on the IC and thus disadvantageously increase design complexity (e.g., auto-place and route (APR) complexity, the size of layout design, etc.). Thus, conventional methods for forming the routing interconnect structure in an IC are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

FIGS. 2A, 2B, 2C, 2D, 2E, 2F, 2G, 2H, 2I, 2J, 2K, 2L, and 2M illustrate cross-sectional views of an exemplary semiconductor device during various fabrication stages, made by the method of FIG. 1, in accordance with some embodiments.

DETAILED DESCRIPTION OF EXEMPLARY EMBODIMENTS

Figure 1:
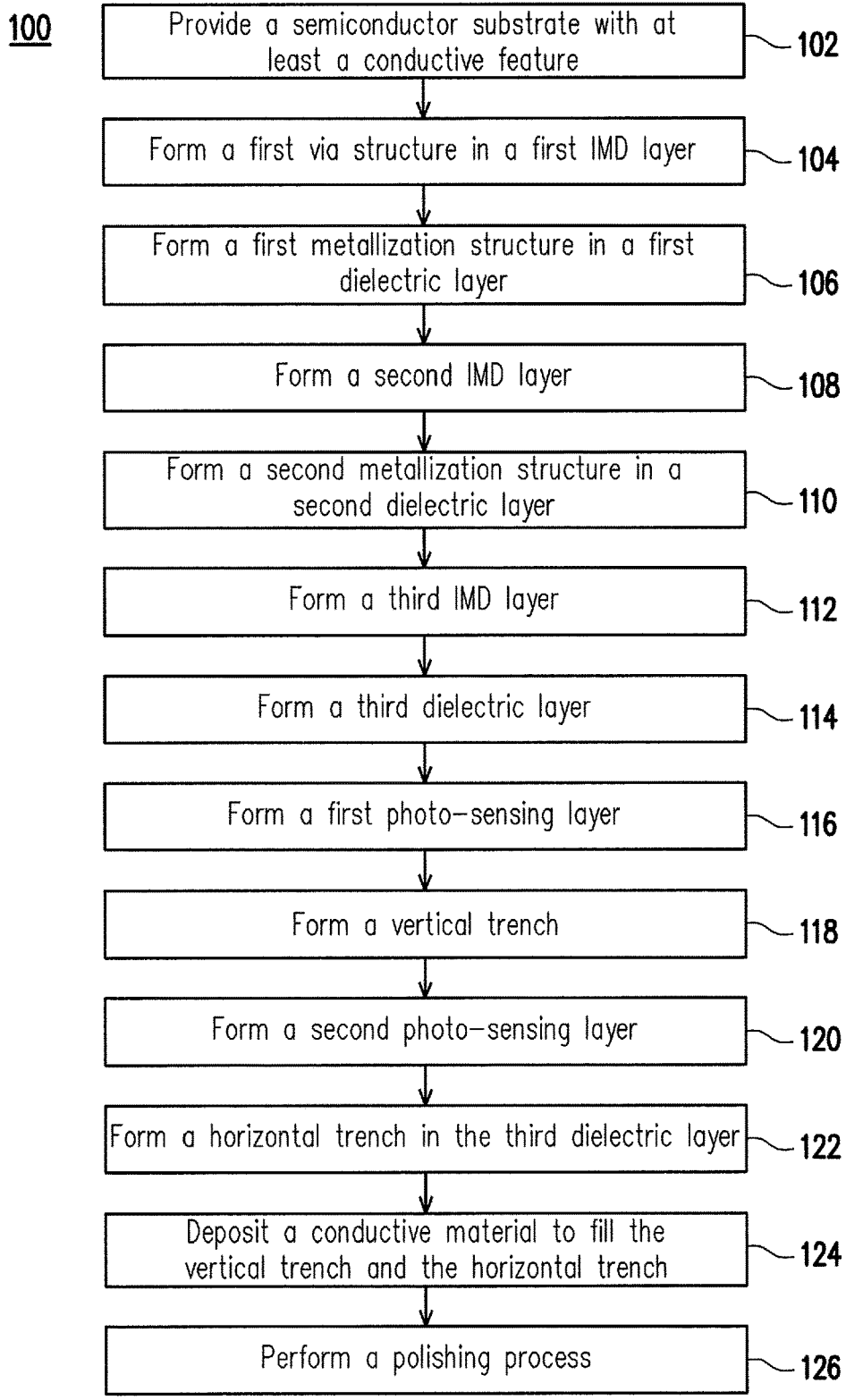
FIG. 1 illustrates a flow chart of an exemplary method for forming a semiconductor device, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

The present disclosure provides various embodiments of a semiconductor device that includes a via tower and methods of forming the same. In accordance with various embodiments of the present disclosure, such a via tower is a vertically conductive structure that is formed to enable a direct electrical coupling between two non-adjacent metallization layers of the semiconductor device. As mentioned above, current integrated circuits (IC's) generally include plural metallization layers (e.g., about 10 metallization layers) on top of one another that are disposed over active devices/circuit elements of the IC. Conventionally, to couple a first metallization layer (a lower layer) to a second metallization layer (a higher layer) that are not adjacent to each other, a routing interconnect structure comprising plural vias that are each formed to couple respective neighboring (i.e., adjacent) metallization layers is typically required, which causes the routing interconnect structure to comprise plural aforementioned interfaces. In contrast, in various embodiments of the present disclosure, two non-adjacent metallization layers can be coupled to each other by one single via tower. Thus a semiconductor device that incorporates a routing interconnect structure to couple two non-adjacent metallization layers by the via tower may include a greatly reduced number of interfaces, which advantageously reduces a resistance value of the routing interconnect structure while requiring no additional parallel vias.

This is particularly useful for transmitting a critical signal (e.g., a power signal, a clock signal, etc.) around the IC. For example, to transmit such a critical signal, for example, from a power supply to an active device, the signal conventionally travels from a power grid layer (e.g., a topmost metallization layer) that is directly coupled to the power supply, through plural intermediate metallization layer and associated vias, to a bottommost metallization layer and to the active device. However, in some embodiments, a semiconductor device may use one single via tower to couple the topmost metallization layer to the bottommost metallization layer, which allows the critical signal to be directly transmitted from the power supply to the active device. Such a direct coupling provides various advantages such as, for example, reduction of a voltage drop (commonly known as "IR (current-resistance) drop") across a power grid network, reduction of power consumption, reduction of unnecessary delays, etc.

FIG. 1 illustrates a flowchart of a method 100 to form a semiconductor device according to one or more embodiments of the present disclosure. It is noted that the method 100 is merely an example, and is not intended to limit the present disclosure. Accordingly, it is understood that additional operations may be provided before, during, and after the method 100 of FIG. 1, and that some other operations may only be briefly described herein.

In some embodiments, operations of the method 100 may be associated with the cross-sectional views of a semiconductor device at various fabrication stages as shown in FIGS. 2A, 2B, 2C, 2D, 2E, 2F, 2G, 2H, 2I, 2J, 2K, 2L, and 2M, respectively, which will be discussed in further detail below. Referring now to FIG. 1, the method 100 starts with operation 102 in which a semiconductor substrate with at least one conductive feature (e.g., a source, drain, and/or gate electrode of a transistor) is provided. The method 100 continues to operation 104 in which a first via structure is formed in a first inter-metal dielectric (IMD) layer so as to cause the conductive feature to become electrically coupleable through the first via structure. The method 100 continues to operation 106 in which a first metallization structure is formed in a first dielectric layer so as to electrically couple the first metallization structure to the first via structure. The method 100 continues to operation 108 in which a second IMD layer is formed over the first dielectric layer. The method 100 continues to operation 110 in which one or more second metallization structures are formed in a second dielectric layer. The method 100 continues to operation 112 in which a third IMD layer is formed over the second dielectric layer. The method 100 continues to operation 114 in which a third dielectric layer is formed over the third IMD layer. The method 100 continues to operation 116 in which a first photo-sensing layer with a first patterned opening is formed over the third IMD layer. The method 100 continues to operation 118 in which a vertical trench is formed by using the first patterned opening to etch through the third dielectric layer, the third IMD layer, the second dielectric layer, and the second IMD layer so as expose at least a portion of a top surface of the first metallization structure. The method 100 continues to operation 120 in which a second photo-sensing layer with a second patterned opening is formed over the third dielectric layer to replace the first photo-sensing layer. The method 100 continues to operation 122 in which a horizontal trench is formed in the third dielectric layer by using the second patterned opening to recess the third dielectric layer. The method 100 continues to operation 124 in which a conductive material is deposited over the third dielectric layer so as to fill the vertical trench and the horizontal trench with the conductive material. The method 100 continues to operation 126 in which a polishing process is performed to remove excessive conductive material so as to form a third metallization structure in the third dielectric layer that is coupled to the first metallization structure by a vertical tower that includes the vertical trench filled with the conductive material.

As mentioned above, FIGS. 2A through 2M illustrate, in a cross-sectional view, a portion of a semiconductor device 200 at various fabrication stages of the method 100 of FIG. 1. The semiconductor device 200 may be included in a microprocessor, memory cell, and/or other integrated circuit (IC). Also, FIGS. 2A through 2M are simplified for a better understanding of the concepts of the present disclosure. For example, although the figures illustrate the semiconductor device 200, it is understood the IC may comprise a number of other devices such as resistors, capacitors, inductors, fuses, etc., which are not shown in FIGS. 2A-2M, for purposes of clarity of illustration.

Figure 2A:
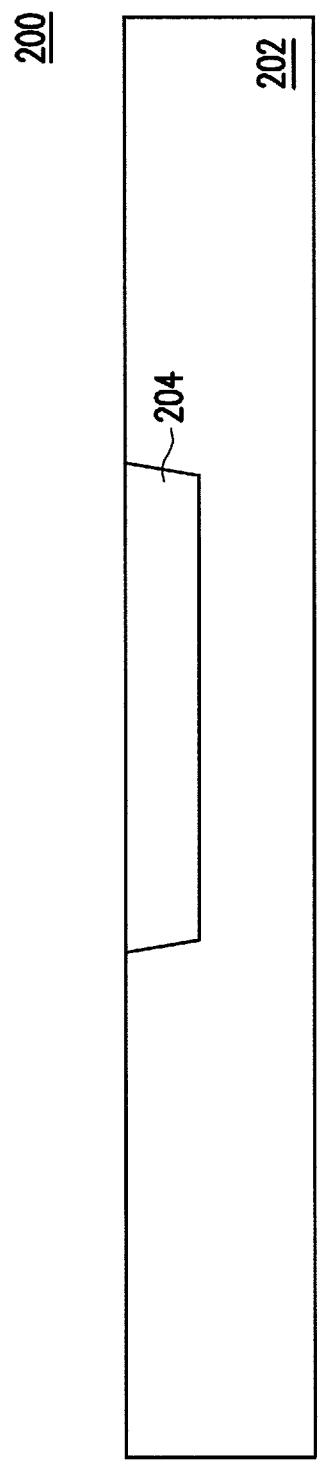

FIG. 2A is a cross-sectional view of the semiconductor device 200 including a substrate 202 with at least one conductive feature 204 at one of the various stages of fabrication corresponding to operation 102 of FIG. 1, in accordance with some embodiments. Although the semiconductor device 200 in the illustrated embodiment of FIG. 2A includes only one conductive feature (e.g., 204), it is understood that the illustrated embodiment of FIG. 2A and the following figures are merely provided for illustration purposes. Thus, the semiconductor device 200 may include any desired number of conductive features while remaining within the scope of the present disclosure.

In some embodiments, the substrate 202 includes a silicon substrate. Alternatively, the substrate 202 may include other elementary semiconductor material such as, for example, germanium. The substrate 202 may also include a compound semiconductor such as silicon carbide, gallium arsenic, indium arsenide, and indium phosphide. The substrate 202 may include an alloy semiconductor such as silicon germanium, silicon germanium carbide, gallium arsenic phosphide, and gallium indium phosphide. In one embodiment, the substrate 202 includes an epitaxial layer. For example, the substrate may have an epitaxial layer overlying a bulk semiconductor. Furthermore, the substrate 202 may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

In some embodiments, the substrate 202 also includes various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 202 may further include other functional features such as a resistor or a capacitor formed in and on the substrate. The substrate 202 further include lateral isolation features provided to separate various devices formed in the substrate 202. In one embodiment, shallow trench isolation (STI) features are used for lateral isolation. The various devices further include silicide disposed on S/D, gate and other device features for reduced contact resistance when coupled to output and input signals.

In an embodiment, the conductive feature 204 may be a source, drain or gate electrode. Alternatively, the conductive feature 204 may be a silicide feature disposed on a source, drain or gate electrode. The silicide feature may be formed by a self-aligned silicide (typically known as "silicide") technique. In another embodiment, the conductive feature 204 may include an electrode of a capacitor or one end of a resistor.

Figure 2B:
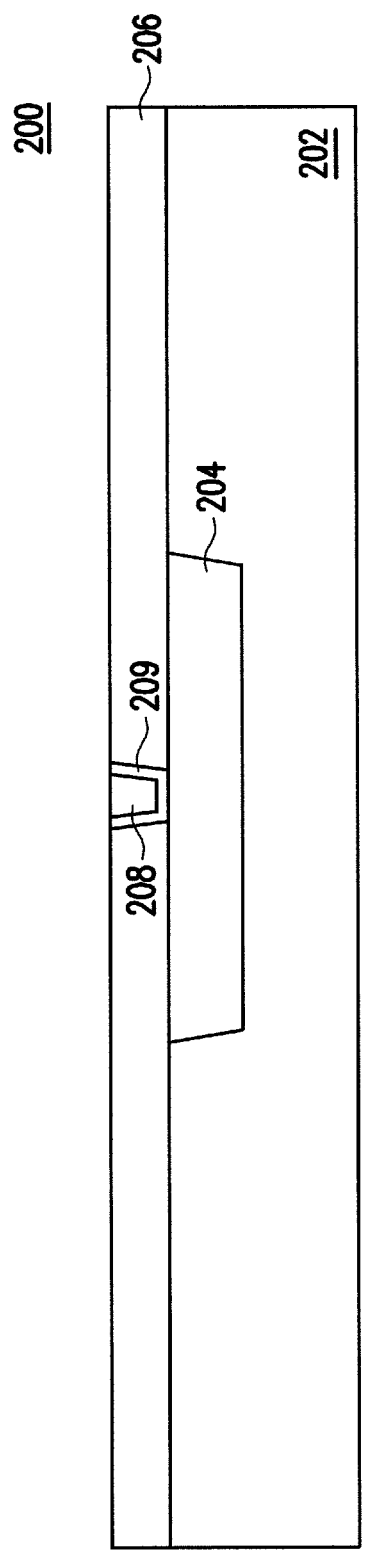

FIG. 2B is a cross-sectional view of the semiconductor device 200 including a first via structure 208 in a first inter-metal dielectric (IMD) layer 206 at one of the various stages of fabrication that corresponds to operation 104 of FIG. 1, in accordance with some embodiments. As shown, the first via structure 208 is configured to extend through the first IMD layer 206 to couple itself to the conductive feature 204. Alternatively, the first via structure 208 may be a conductive plug. In some further embodiments, the semiconductor device 200 may include a barrier layer 209 surrounding sidewalls and bottom surface of the via structure 208.

The first IMD layer 206 includes a material that is at least one of: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. Since the material of the first IMD layer 206 will be used by other dielectric layers formed subsequently, for ease of discussion, the material is herein referred to as "material D."

In some embodiments, the via structure 208 includes a metal material such as, for example, copper (Cu), tungsten (W), or a combination thereof. In some other embodiments, the via structure 208 may include other suitable metal materials (e.g., gold (Au), cobalt (Co), silver (Ag), etc.) and/or conductive materials (e.g., polysilicon) while remaining within the scope of the present disclosure. Similarly, since the material of the first via structure 208 will be used by other conductive structures formed subsequently, for ease of discussion, the material is herein referred to as "material M."

In some embodiments, the barrier layer 209 includes tantalum nitride (TaN), tantalum (Ta), titanium nitride (TiN), titanium (Ti), cobalt tungsten (CoW), tungsten nitride (WN), or the like. The barrier layer 209 may effectively prevent metal atoms from diffusing into the first IMD layer during a metal deposition process to form the via structure 208, which will be discussed below. Similarly, since the material of the barrier layer 209 will be used by other barrier layers formed subsequently, for ease of discussion, the material of the barrier layer 209 is herein referred to as "material B."

The first via structure 208 may be formed by at least some of the following process steps: using chemical vapor deposition (CVD), physical vapor deposition (PVD), spin-on coating, and/or other suitable techniques to deposit the material D over the substrate 202 and the conductive feature 204 to form an initial first IMD layer (the first IMD layer 206 is a remaining portion of the initial first IMD layer after the later performed patterning process); performing one or more patterning processes (e.g., a lithography process, a dry/wet etching process, a cleaning process, a soft/hard baking process, etc.) to form an opening through the initial first IMD layer; using CVD, PVD, and/or other suitable techniques to deposit the aforementioned material B along a bottom surface and sidewalls of the opening to surround the opening; using CVD, PVD, E-gun, and/or other suitable techniques to fill the opening with the material M, and polishing out excessive material M to form the via structure 208.

Figure 2C:
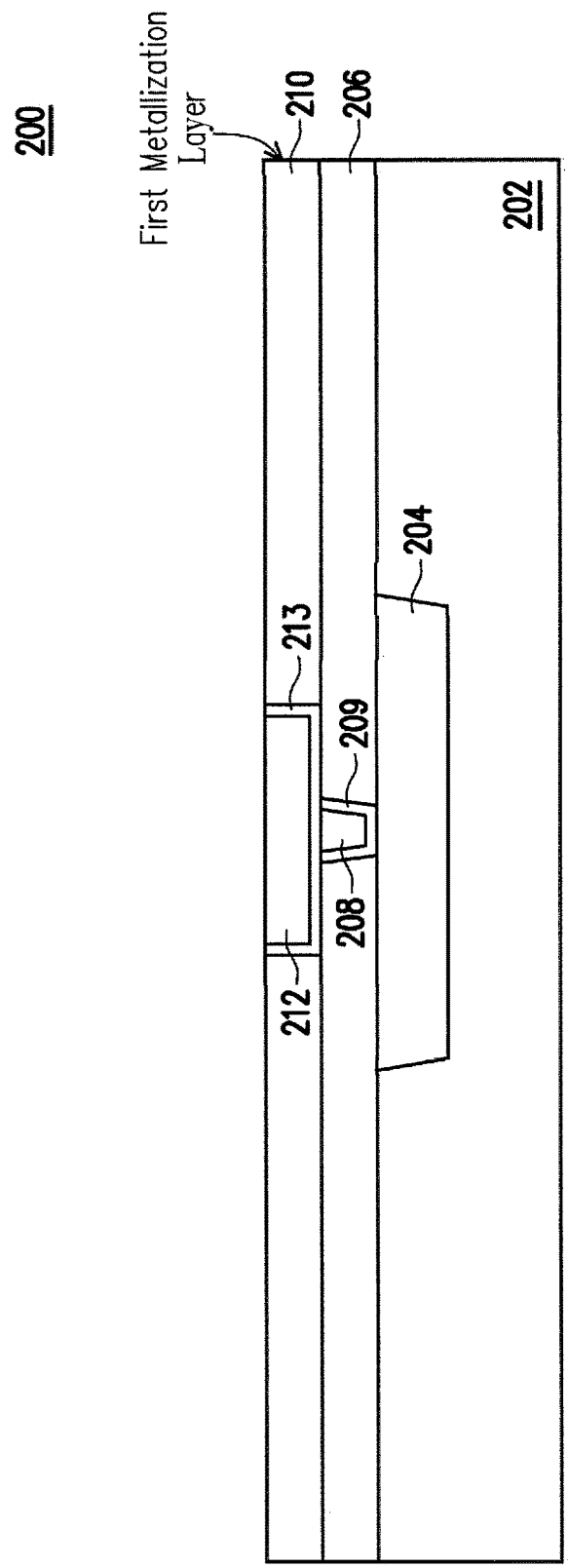

FIG. 2C is a cross-sectional view of the semiconductor device 200 including a first metallization structure 212 formed in a first dielectric layer 210 at one of the various stages of fabrication that corresponds to operation 106 of FIG. 1, in accordance with some embodiments. In some embodiments, the first dielectric layer 210 including the first metallization structure 212 is herein referred to as the "first metallization layer."

As shown, the first metallization structure 212 is coupled to the first via structure 208, and horizontally extends over a respective width in the first dielectric layer 210. In some embodiments, the first metallization structure 212 may be wider than the first via structure 208. In some further embodiments, the semiconductor device 200 may include a barrier layer 213 surrounding sidewalls and bottom surface of the first metallization structure 212.

In some embodiments, the first dielectric layer 210 includes the material D; the first metallization structure 212 includes the material M; and the barrier layer 213 includes the material B. The first metallization structure 212 may be formed by at least some of the following process steps: using CVD, PVD, spin-on coating, and/or other suitable techniques to deposit the material D over the first IMD layer 206 and the first via structure 208 to form an initial first dielectric layer (the first dielectric layer 210 is a remaining portion of this initial first dielectric layer after the later performed patterning process); performing one or more patterning processes (e.g., a lithography process, a dry/wet etching process, a cleaning process, a soft/hard baking process, etc.) to form an opening through the initial first dielectric layer; using CVD, PVD, and/or other suitable techniques to deposit the aforementioned material B to surround the opening; using CVD, PVD, E-gun, and/or other suitable techniques to fill the opening with the material M, and polishing out excessive material M to form the first metallization structure 212.

Figure 2D:
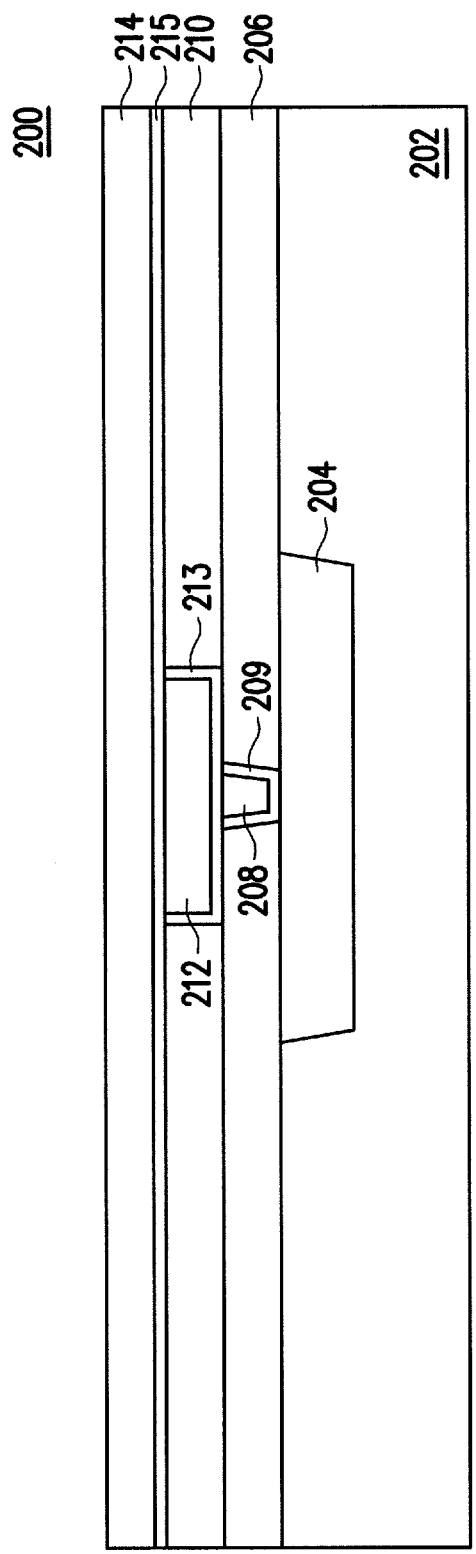

FIG. 2D is a cross-sectional view of the semiconductor device 200 including a second IMD layer 214 formed over the first dielectric layer 210 and the first metallization structure 212 at one of the various stages of fabrication that corresponds to operation 108 of FIG. 1, in accordance with some embodiments. In some embodiments, the second IMD layer 214 includes the material D. The second IMD layer 214 may be formed by using CVD, PVD, spin-on coating, and/or other suitable techniques to deposit the material D over the first dielectric layer 210 and the first metallization structure 212.

Further, in some embodiments, prior to forming the second IMD layer 214 over the first dielectric layer 210, an etch stop layer 215 is formed over the first dielectric layer 210 and the first metallization structure 212. That is, the etch stop layer 215 is disposed between the first dielectric layer 210 and the second IMD layer 214, as shown in FIG. 2D (and figures of following stages). The etch stop layer 215 may be formed of silicon nitride (SiN), silicon carbon nitride (SiCN), silicon carbon oxide (SiCO), silicon oxynitride (SiON), carbon nitride (CN), combinations thereof, or the like, and deposited by CVD or plasma-enhanced CVD (PECVD) techniques. In general, each of the above-described materials of such an etch stop layer (e.g., 215) has a significantly higher etch resistance than the etch resistance of the material D (i.e., the material of the second IMD layer 214, etc.) so that the etch stop layer 215 may be configured to stop an etching process, which will be discussed in further detail below.

Figure 2E:
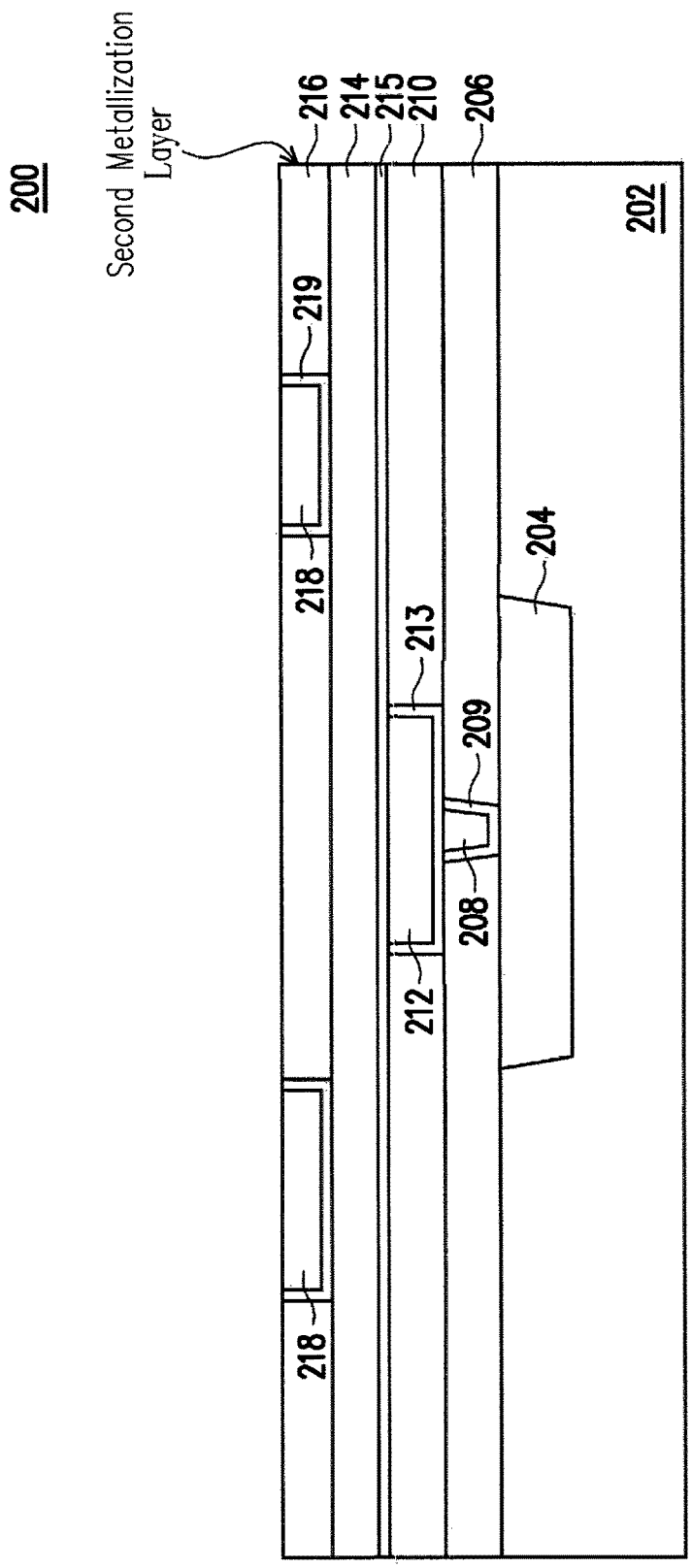

FIG. 2E is a cross-sectional view of the semiconductor device 200 including one or more second metallization structures 218 formed in a second dielectric layer 216 at one of the various stages of fabrication that corresponds to operation 110 of FIG. 1, in accordance with some embodiments. In some embodiments, the second dielectric layer 216 including the second metallization structures 218 is herein referred to as the "second metallization layer."

As shown, the second dielectric layer 216 is formed above the second IMD layer 214, and each of the second metallization structures 218 extends horizontally above the first dielectric layer 210 and is horizontally spaced from the first metallization structure 212 such that the first metallization structure 212 is horizontally disposed between two second metallization structures 218. In some further embodiments, the semiconductor device 200 may include a barrier layer 219 surrounding the sidewalls and bottom surface of each respective second metallization structure 218.

In some embodiments, the second dielectric layer 216 includes the material D; the second metallization structure 218 includes the material M; and the barrier layer 219 includes the material B. The second metallization structure 218 may be formed by at least some of the following process steps: using CVD, PVD, spin-on coating, and/or other suitable techniques to deposit the material D over the second IMD layer 214 to form an initial second dielectric layer (the second dielectric layer 216 is a remaining portion of this initial second dielectric layer after the later performed patterning process); performing one or more patterning processes (e.g., a lithography process, a dry/wet etching process, a cleaning process, a soft/hard baking process, etc.) to form an opening through the initial second dielectric layer; using CVD, PVD, and/or other suitable techniques to deposit the aforementioned material B to surround the opening; using CVD, PVD, E-gun, and/or other suitable techniques to fill the opening with the material M, and polishing out excessive material M to form the second metallization structure 218.

Figure 2F:
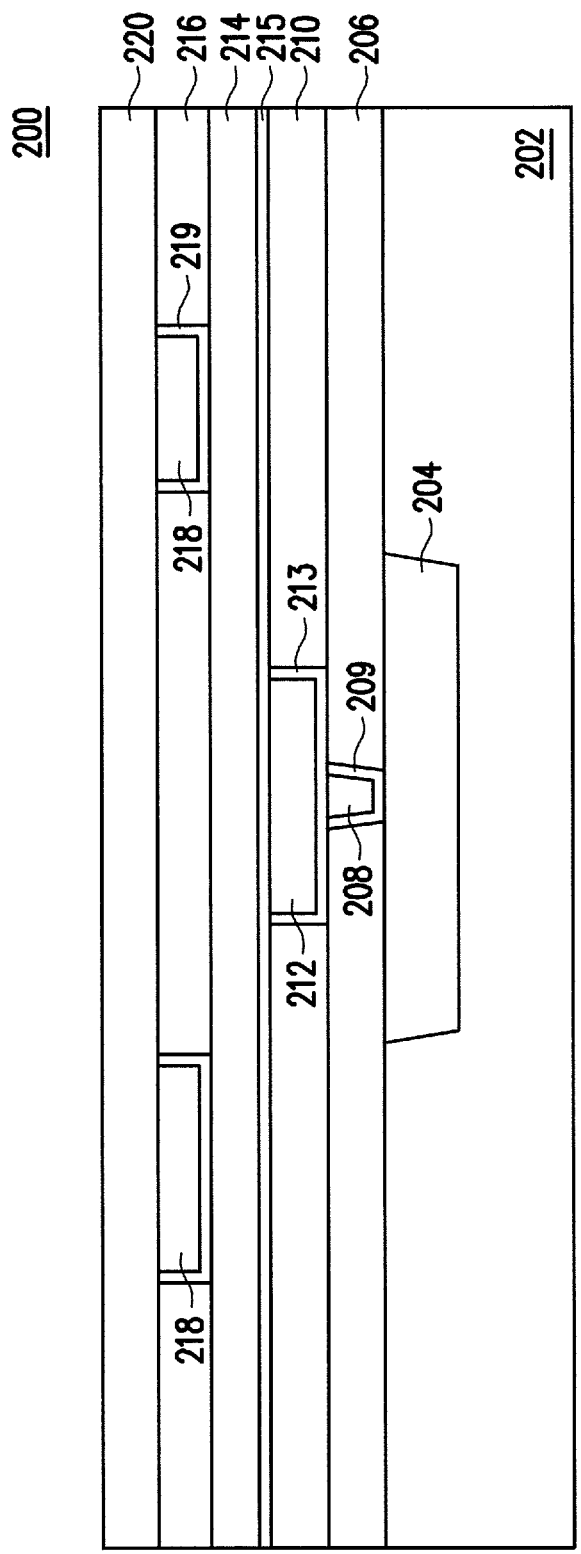

FIG. 2F is a cross-sectional view of the semiconductor device 200 including a third IMD layer 220 formed over the second dielectric layer 216 and the second metallization structures 218 at one of the various stages of fabrication that corresponds to operation 112 of FIG. 1, in accordance with some embodiments. In some embodiments, the third IMD layer 220 includes the material D. The third IMD layer 220 may be formed by using CVD, PVD, spin-on coating, and/or other suitable techniques to deposit the material D over the second dielectric layer 216 and the second metallization structures 218.

Figure 2G:
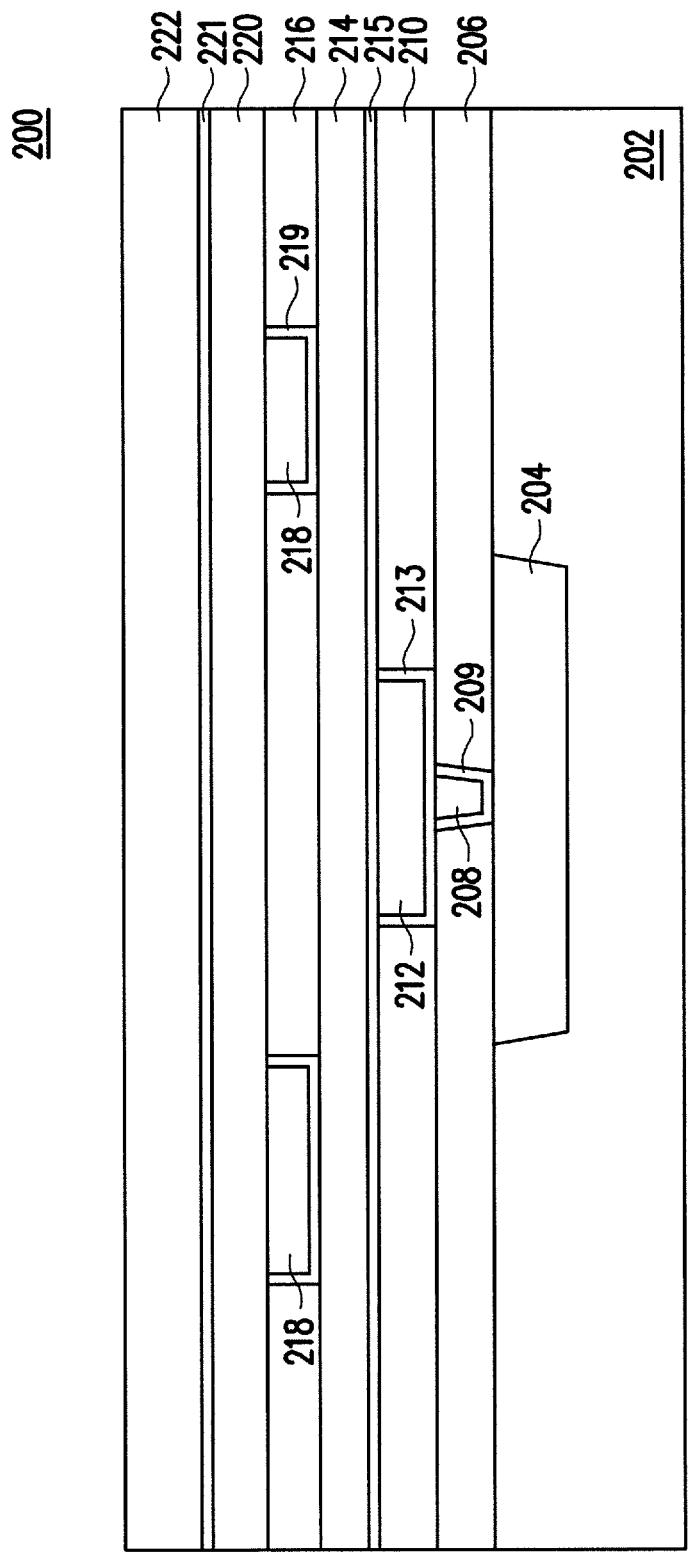

FIG. 2G is a cross-sectional view of the semiconductor device 200 including a third dielectric layer 222 formed over the third IMD layer 220 at one of the various stages of fabrication that corresponds to operation 114 of FIG. 1, in accordance with some embodiments. In some embodiments, the third dielectric layer 222 includes the material D. The third dielectric layer 222 may be formed by using CVD, PVD, spin-on coating, and/or other suitable techniques to deposit the material D over the third IMD layer 220.

Further, in some embodiments, prior to forming the third dielectric layer 222 over the third IMD layer 220, an etch stop layer 221 is formed over the third IMD layer 220. That is, the etch stop layer 221 is disposed between the third IMD layer 220 and the third dielectric layer 222, as shown in FIG. 2G (and figures of following stages). Similar to the etch stop layer 215 (FIG. 2G), the etch stop layer 221 may be formed of silicon nitride (SiN), silicon carbon nitride (SiCN), silicon carbon oxide (SiCO), silicon oxynitride (SiON), carbon nitride (CN), combinations thereof, or the like, and deposited by CVD or plasma-enhanced CVD (PECVD) techniques. In general, each of the above-described materials of such an etch stop layer (e.g., 221) has a significantly higher etch resistance than the etch resistance of the material D (i.e., the material of the third IMD layer 220, the third dielectric layer 222, etc.) so that the etch stop layer 221 may be configured to stop an etching process, which will be discussed in further detail below.

Figure 2H:
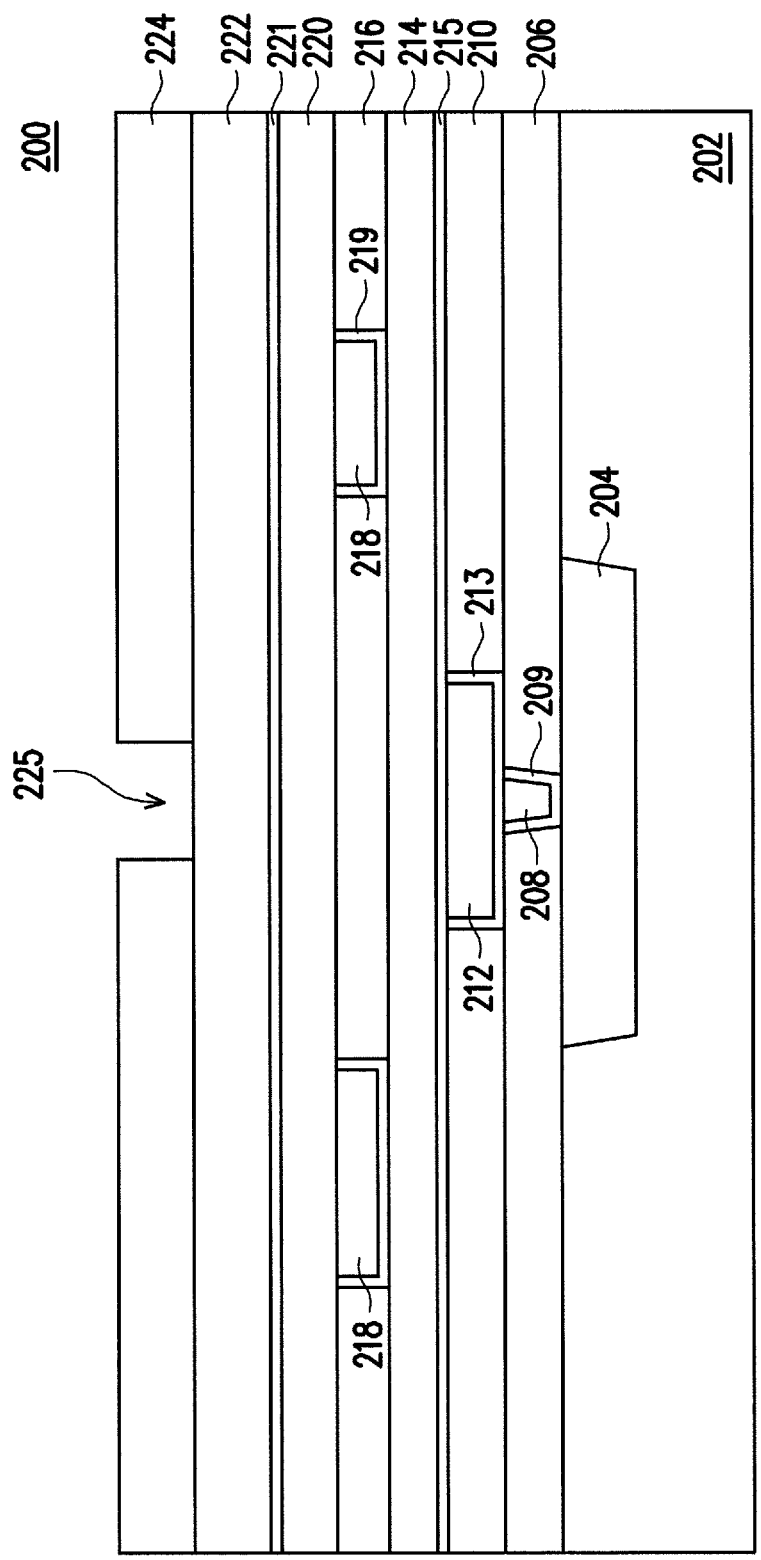
Figure 21:
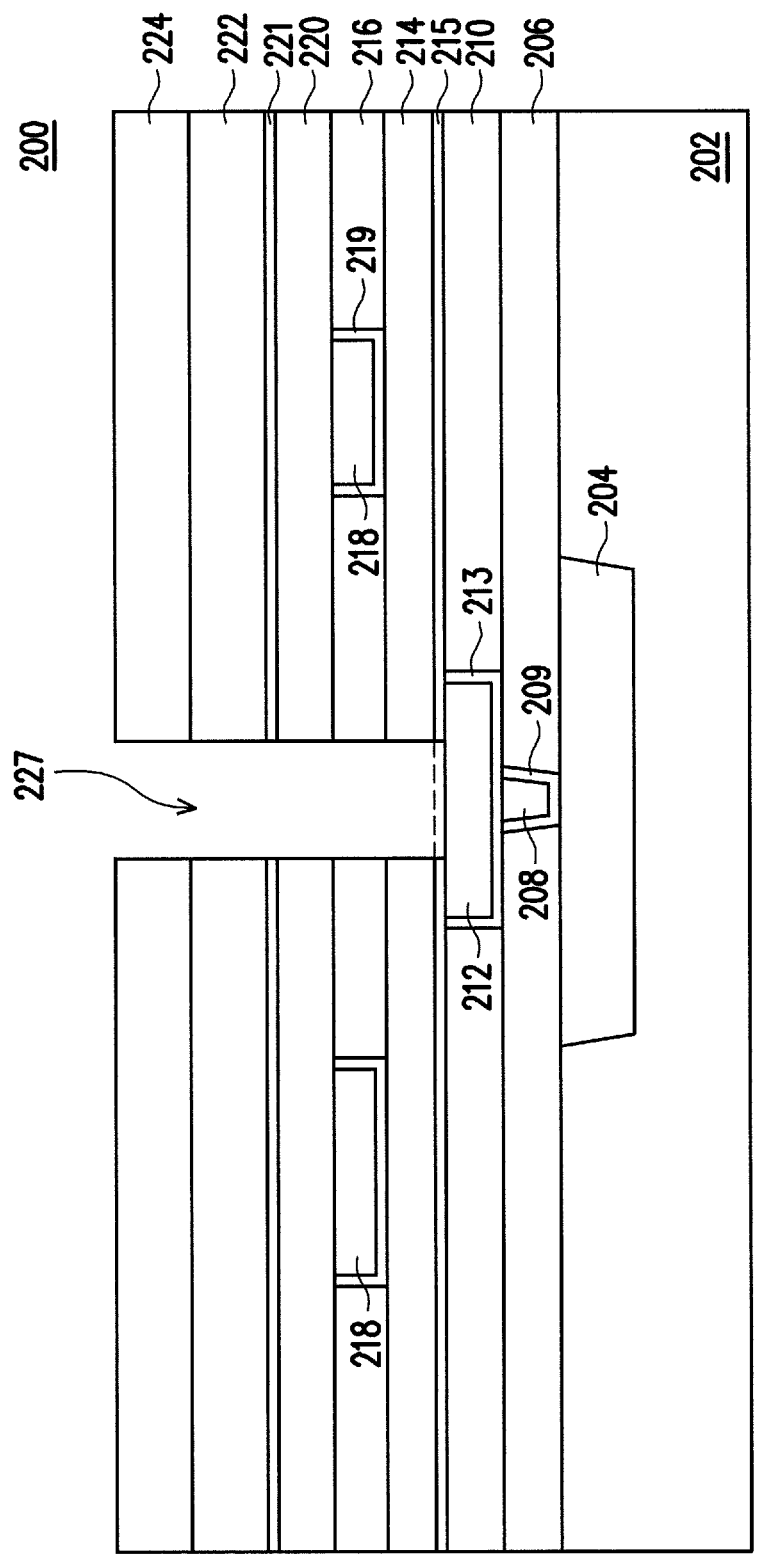

FIG. 2H is a cross-sectional view of the semiconductor device 200 including a first patterned photo-sensing layer 224 formed over the third dielectric layer 222 at one of the various stages of fabrication that corresponds to operation 116 of FIG. 1, in accordance with some embodiments. As shown, the first patterned photo-sensing layer 224 includes a patterned opening 225. In some embodiments, the opening 225 is selected to align at least part of the first metallization structure 212 so as to allow a later formed via tower to couple to the first metallization structure 212, which will be discussed below.

In some embodiments, the first patterned photo-sensing layer 224 may include a negative or positive tone photoresist material that is patternable in response to a photolithography light source. In some alternative embodiments, the first patterned photo-sensing layer 224 may include e-beam (electron beam) resist layer (e.g., poly methyl methacrylate, methyl methacrylate, etc.) that is patternable in response to a e-beam lithography energy source. The first patterned photo-sensing layer 224 is formed by first forming a photoresist material over the third dielectric layer 222 using a deposition process known in the art such as, for example, a spin-coating process, or the like. The photoresist material is then patterned in a photolithography process that may involve various exposure, developing, baking, stripping, and etching processes. As a result, the first patterned photo-sensing layer 224 that has the opening 225 is formed.

FIG. 2I is a cross-sectional view of the semiconductor device 200 including a vertical trench 227 extending across the first photo-sensing layer 224, the third dielectric layer 222, the third IMD layer 220, the second dielectric layer 216, and the second IMD layer 214 at one of the various stages of fabrication that corresponds to operation 118 of FIG. 1, in accordance with some embodiments. As shown, the formation of the vertical trench 227 exposes a portion of the top surface of the first metallization structure 212. In some embodiments, the vertical trench 227 may be formed by using the first photo-sensing layer 224 as a mask to perform one or more dry/wet etching processes to respectively or simultaneously etch the third dielectric layer 222, the third IMD layer 220, the second dielectric layer 216, and the second IMD layer 214, which may be stopped by the etch stop layer 215, and perform at least another dry/wet etching process to remove an exposed portion of the etch stop layer 215 (as shown in dotted line).

More specifically, in the embodiments in which the material D (i.e., the material of the second IMD layer 214, the second dielectric layer 216, the third IMD layer 220, and the third dielectric layer 222) includes silicon oxide, the wet etching process to etch the third dielectric layer 222, the third IMD layer 220, the second dielectric layer 216, and the second IMD layer 214 may be performed by using hydrofluoric acid or the like; and the dry etching process to etch the third dielectric layer 222, the third IMD layer 220, the second dielectric layer 216, and the second IMD layer 214 may be performed by using etchant gases, for example, tetrafluoromethane ($CF_4$), fluoroform ($CHF_3$), difluoromethane ($CH_2F_2$), octafluorocyclobutane ($C_4F_8$), argon (Ar), and/or oxygen ($O_2$). And the at least another dry/wet etching process to remove the exposed portion of the etch stop layer 215 may be performed by using similar acid solution/etchant gases but with a different concentration (so as to have a higher etching rate).

Figure 2J:
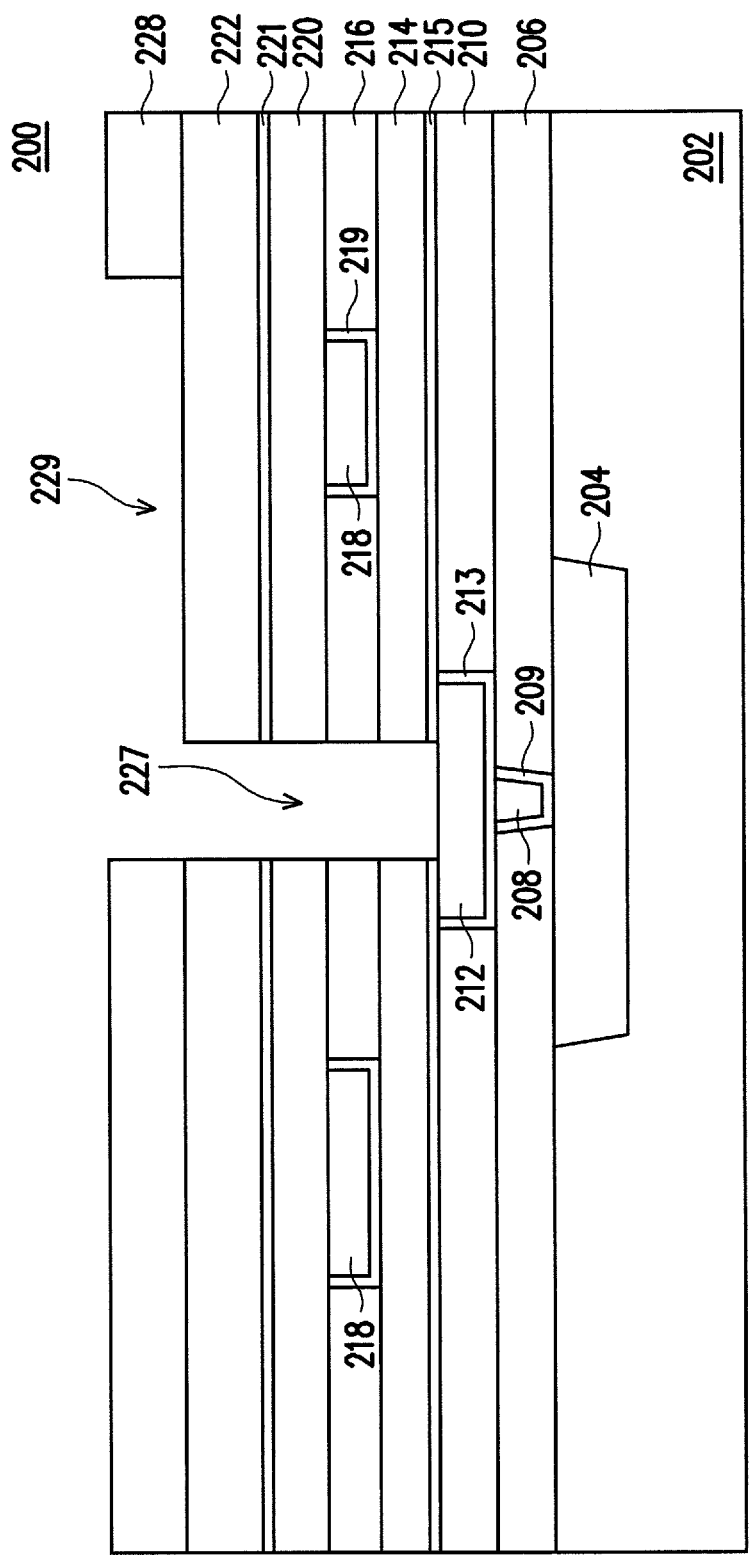

FIG. 2J is a cross-sectional view of the semiconductor device 200 including a second patterned photo-sensing layer 228 formed over the third dielectric layer 222 at one of the various stages of fabrication that corresponds to operation 120 of FIG. 1, in accordance with some embodiments. As shown, the second photo-sensing layer 228 includes an opening 229 that overlaps an upper portion of the vertical trench 227.

In some embodiments, the second patterned photo-sensing layer 228 is formed by first removing the first patterned photo-sensing layer 224, and forming a photoresist material over the third dielectric layer 222 using a deposition process known in the art such as, for example, a spin-coating process, or the like. The photoresist material is then patterned in a photolithography process that may involve various exposure, developing, baking, stripping, and etching processes. As a result, the second patterned photo-sensing layer 228 that has the opening 229 is formed.

Figure 2K:
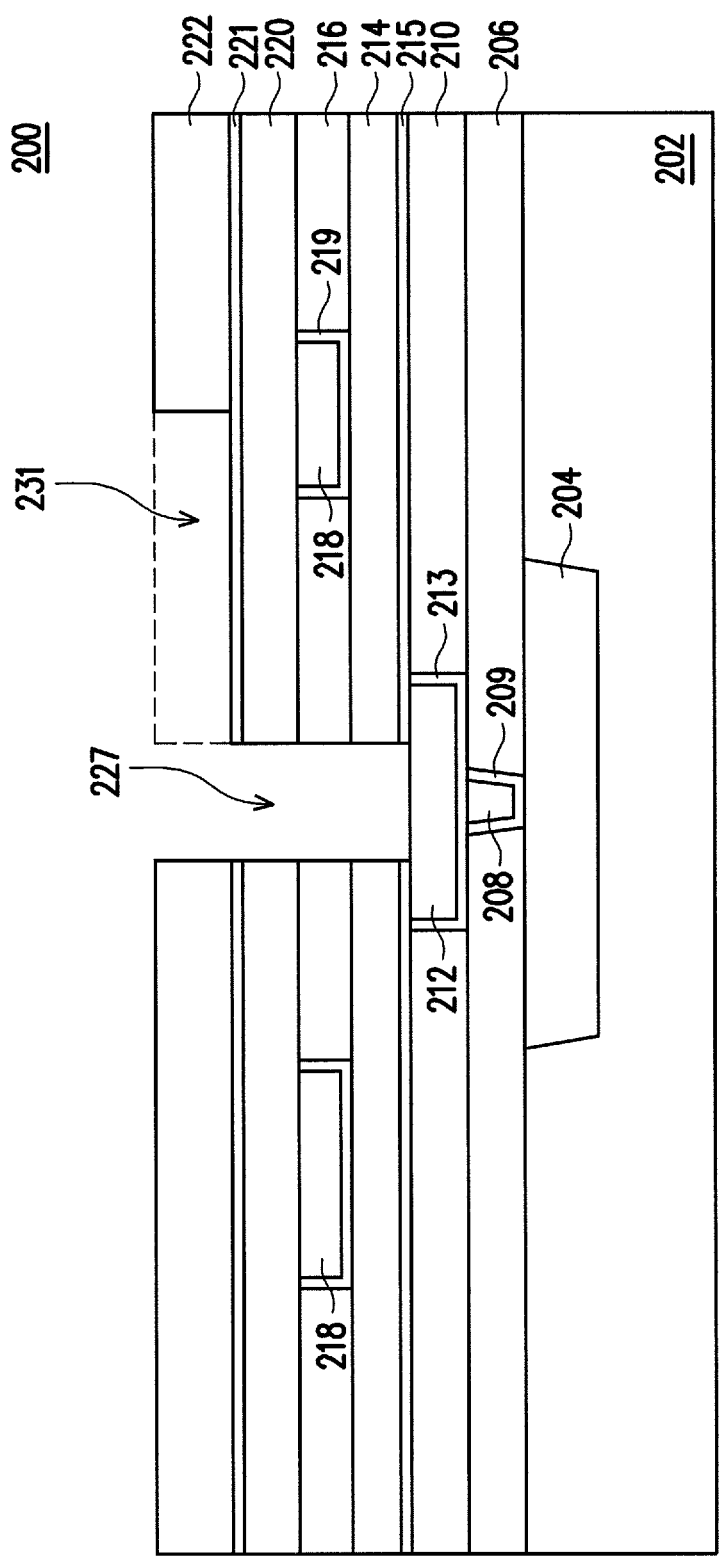

FIG. 2K is a cross-sectional view of the semiconductor device 200 including a horizontal trench 231 formed in the third dielectric layer 220 at one of the various stages of fabrication that corresponds to operation 122 of FIG. 1, in accordance with some embodiments. As shown, the horizontal trench 231 (in dotted line) is coupled to the vertical trench 227, and horizontally extends over the third dielectric layer 220 a predetermined distance, or width.

In some embodiments, the horizontal trench 231 is formed by using the second photo-sensing layer 228 (FIG. 2J) as a mask to perform at least one dry/wet etching process to etch the third dielectric layer 222. More specifically, in the embodiments in which the material D (i.e., the material of the third dielectric layer 222) includes silicon oxide, the wet etching process may be performed by using hydrofluoric acid or the like; and the dry etching process may be performed by using etchant gases, for example, tetrafluoromethane ($CF_4$), fluoroform ($CHF_3$), difluoromethane ($CH_2F_2$), octafluorocyclobutane ($C_4F_8$), argon (Ar), and/or oxygen ($O_2$). As mentioned above with respect to FIG. 2G, such an at least one dry/wet etching process may be stopped by the etch stop layer 221 that has a significantly higher etch resistance than the etch resistance of the material D (i.e., the material of the third IMD layer 220).

Figure 2L:
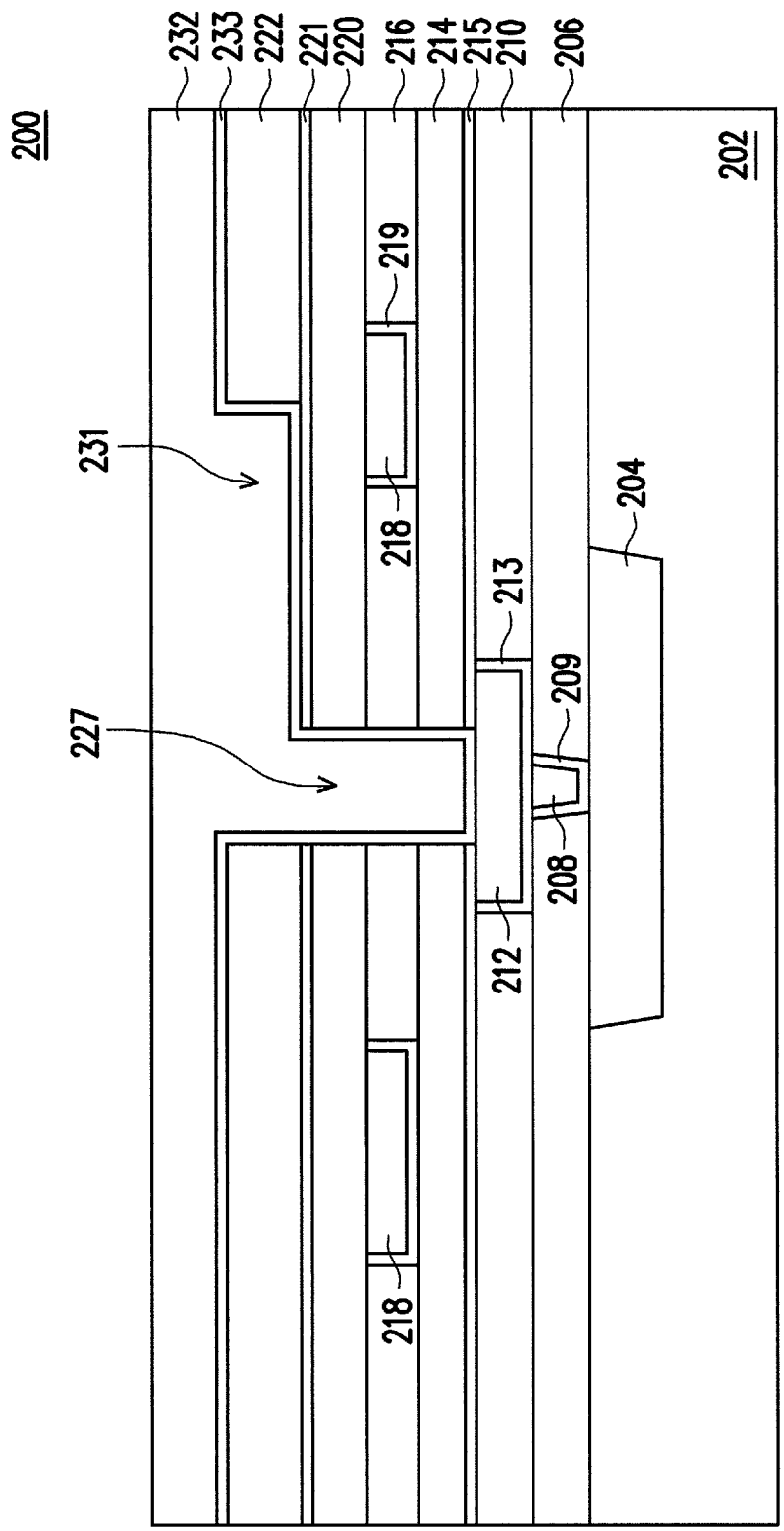

FIG. 2L is a cross-sectional view of the semiconductor device 200 including a conductive material 232 formed over the vertical trench 227 and the horizontal trench 231 at one of the various stages of fabrication that corresponds to operation 124 of FIG. 1, in accordance with some embodiments. In some further embodiments, the semiconductor device 200 may include a barrier layer 233 surrounding sidewalls and a bottom surface of the vertical trench 227, a sidewall and a bottom surface of the horizontal trench 231, and a top surface of the third IMD layer 220.

In accordance with some embodiments, the conductive material 232 includes the material M and the barrier layer 233 includes the material B. In some embodiments, the conductive material 232 may be formed by using CVD, PVD, and/or other suitable techniques to deposit the aforementioned material B along the sidewalls and bottom surface of the vertical trench 227, the sidewall and bottom surface of the horizontal trench 231, and the top surface of the third IMD layer 220, and using CVD, PVD, E-gun, and/or other suitable techniques to fill the vertical trench 227 and the horizontal trench 231 with the material M.

Figure 2M:
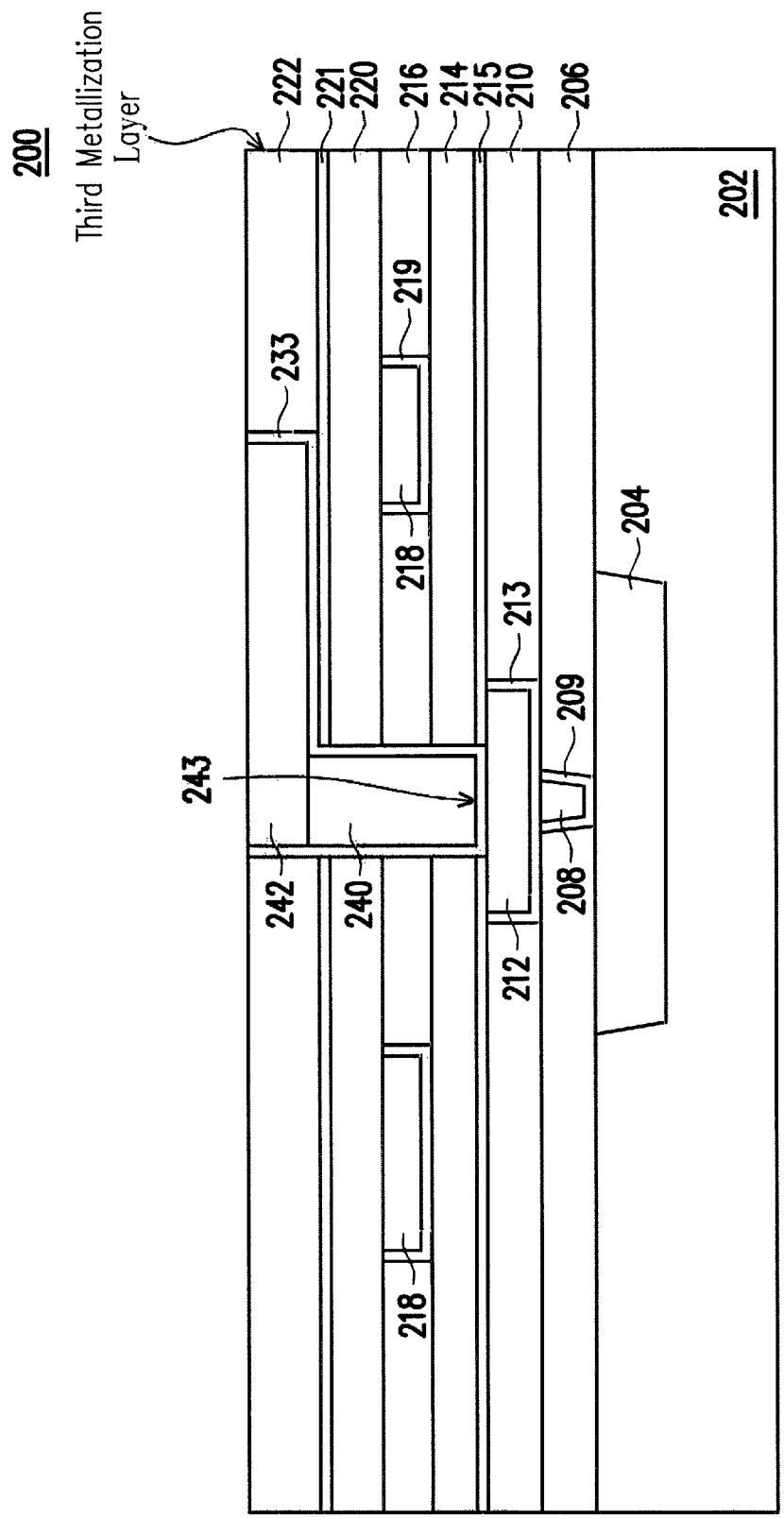

FIG. 2M is a cross-sectional view of the semiconductor device 200 including a via tower 240 and a third metallization structure 242 at one of the various stages of fabrication that corresponds to operation 126 of FIG. 1, in accordance with some embodiments. As shown, the via tower 240 is formed across the second IMD layer 214, the second dielectric layer 216, and the third IMD layer 220, and the third metallization structure 242 is formed in the third dielectric layer 222. In some embodiments, the third dielectric layer 222 including the third metallization structure 242 is herein referred to as the "third metallization layer." In some embodiments, the via tower 240 and third metallization structure 242 may be formed by performing a polishing process on the conductive material 232 (FIG. 2L) to polish out excessive conductive material 232 and part of the barrier layer 233 that is formed over the top surface of the third dielectric layer 222.

In some embodiments, the via tower 240 and the third metallization structure 242 are coupled to each other. And more particularly, the via tower 240 is coupled between the first metallization structure 212 formed in the first dielectric layer 210 (i.e., the first metallization layer) and the third metallization structure 242 formed in the third dielectric layer 222 (i.e., the third metallization layer) without being coupled to the second metallization structures 218 in the second dielectric layer 216 (i.e., the second metallization layer).

That is, by using the above-described method 100 (FIG. 1) to form a via tower (e.g., 240), in some embodiments, metallization structures in two non-adjacent metallization layers (e.g., the first and third metallization layers) can be directly coupled to each other to form a routing interconnect structure without being electrically coupled to metallization structure(s) in adjacent metallization layer(s) (e.g., the second metallization layer) and associated via structures (not shown). As such, the number of interfaces along the routing interconnect structure may be minimized. In the example of FIG. 2M, only one interface 243 is present along the routing interconnect structure formed by the first metallization structure 212, the via tower 240, and the third metallization structure 242.

Although the above-illustrated semiconductor device 200 (FIGS. 2A-2M) includes only three metallization layers, any desired number of metallization layers can be included in the semiconductor device 200 while remaining within the scope of the present disclosure. Thus, it is understood by people of ordinary skill in the art that the disclosed method 100 of FIG. 1 allows to form a via tower to couple a bottommost metallization layer to a topmost metallization layer (typically 10 levels higher than the bottommost metallization layer) without coupling to any intermediate metallization layers. As mentioned above, such a topmost metallization layer is typically used as part of a power grid network, which will be shown and discussed in FIG. 3.

Figure 3:
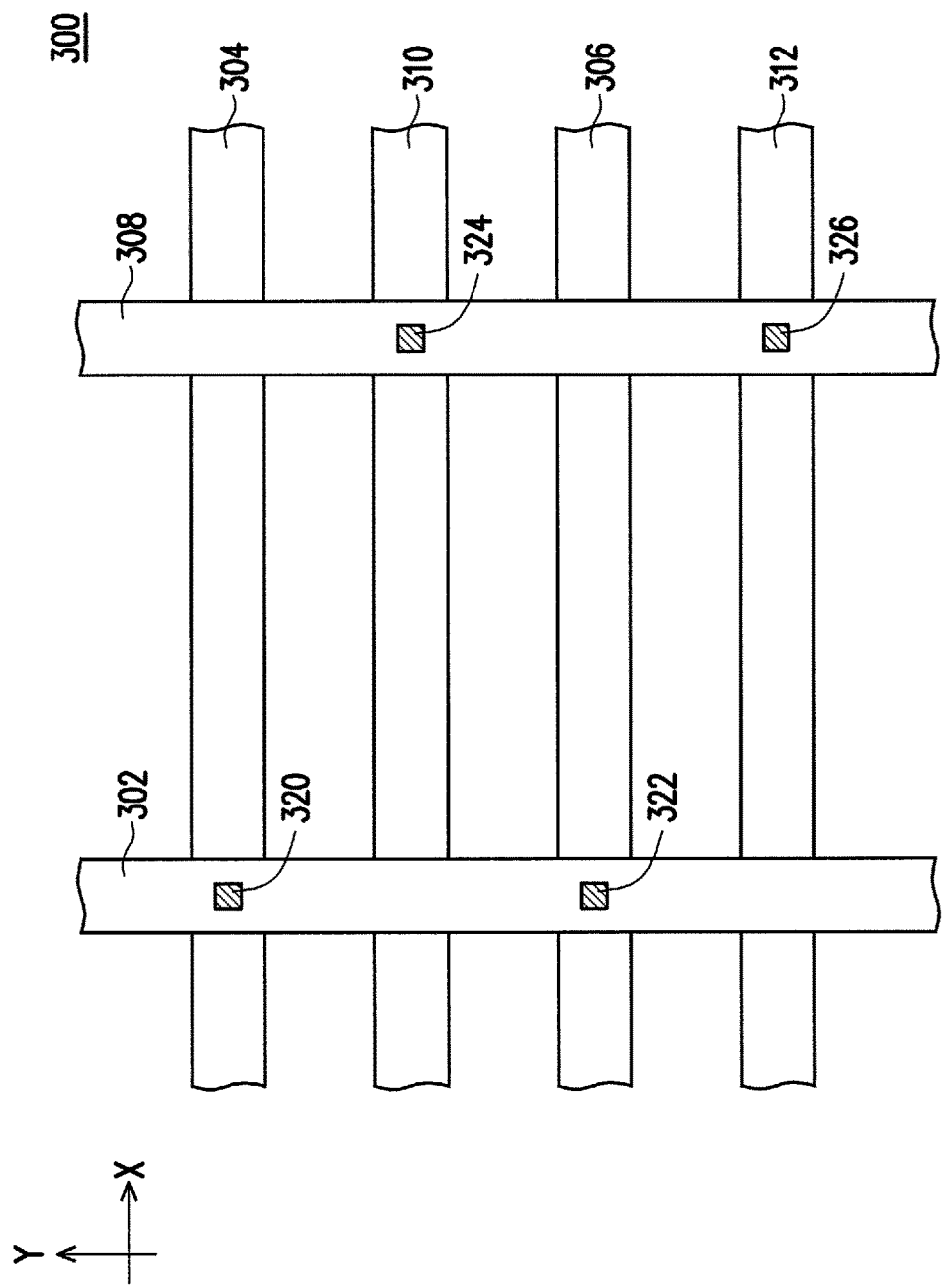
FIG. 3 illustrates a top view of an exemplary power grid network formed as a topmost metallization layer of the semiconductor device of FIGS. 2A-2M, in accordance with some embodiments.

For proper operations of integrated circuits, power is typically required to be supplied and distributed appropriately, which leads to a need for appropriate distribution of operation voltages VDD and VSS. FIG. 3 illustrates a top view of an exemplary power grid network 300 for distributing operation voltages VDD and VSS throughout a chip. As shown, the power grid network 300 includes VDD lines 302, 304, and 306 distributed throughout respective devices/conductive features on the chip and carry operation voltage VDD to those devices/conductive features, and VSS lines 308, 310, and 312 distributed throughout respective devices/conductive features on the chip and carry operation voltage VSS to those devices/conductive features.

In some embodiments, the VDD line 302 and the VSS line 308 (along the Y direction) may be formed as a topmost metallization layer of a semiconductor device; and the VDD lines 304 and 306, and the VSS lines 310 and 312 (along the X direction) may be formed as a bottommost metallization layer of the semiconductor device. Such a topmost metallization layer is typically disposed about 10 levels higher than the bottommost metallization layer that is typically coupled to a conductive feature (e.g., a source, drain or gate electrode). And, as further shown in FIG. 3, the VDD line 302 on the topmost metallization layer is coupled to the VDD lines 304 and 306 on the bottommost metallization layer through via towers 320 and 322, respectively; and the VSS line 308 on the topmost metallization layer is coupled to the VSS lines 310 and 312 on the bottommost metallization layer through via towers 324 and 326, respectively.

Accordingly, by using the method 100 of FIG. 1, the VDD line 302 may be formed as the metallization structure 242, the VDD lines 304 and 306 may be formed as the metallization structure 212, and the via towers 320/322 may be formed as the via tower 240 (FIG. 2M). As such, the via towers 320/322 can directly couple the VDD from the VDD line 302 (at the topmost metallization layer) to the metal structure (e.g., 212) at the bottommost metallization layer that, in general, directly couples to the conductive feature (e.g., 204) through a relatively short conductive feature (e.g., 208). Similarly, the via towers 324/326 can directly couple the VSS from the VSS line 308 (at the topmost metallization layer) to the metal structure (e.g., 212) at the bottommost metallization layer that, in general, directly couples to the conductive feature (e.g., 204) through a relatively short conductive feature (e.g., 208). Accordingly, the above-described advantages (e.g., reduction of IR drop across a power grid network, reduction of power consumption, reduction of unnecessary delays, etc.) may be reached because of such a direct coupling of VDD/VSS to a bottommost metal structure.

In an embodiment, a semiconductor device includes first, second, and third metallization layers, on top of one another, that are disposed above a substrate, wherein each of the first, second, and third metallization layer comprises a respective metallization structure formed in a respective dielectric layer, wherein the second metallization layer is disposed between the first and third metallization layers; and a via tower structure that extends from the first metallization layer to the third metallization layer so as to electrically couple at least part of the respective metallization structures of the first and third metallization layers.

In another embodiment, a semiconductor device includes a substrate; first, second, and third metallization layers, on top of one another, that are disposed above the substrate, wherein each of the first, second, and third metallization layer comprises a respective metallization structure formed in a respective dielectric layer, and wherein the first and the third metallization layers are bottommost and topmost metallization layers of the semiconductor device, respectively; and a via tower structure that extends from the first metallization layer to the third metallization layer so as to electrically couple at least part of the respective metallization structures of the first and third metallization layers.

Yet in another embodiment, a semiconductor device includes first, second, and third metallization layers, on top of one another, that are disposed above a substrate, wherein each of the first, second, and third metallization layer comprises a respective metallization structure formed in a respective dielectric layer, and wherein the second metallization layer is disposed between the first and third metallization layers and the third metallization layer is part of a power grid network; and a via tower structure that extends from the first metallization layer to the third metallization layer so as to electrically couple at least part of the respective metallization structures of the first and third metallization layers.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    first, second, and third metallization layers, on top of one another, that are disposed above a substrate, wherein each of the first, second, and third metallization layers comprises a respective metallization structure formed in a respective dielectric layer, wherein the second metallization layer is disposed between the first and third metallization layers; and
    a via tower structure formed within a single vertical trench that extends from the first metallization layer to the third metallization layer so as to electrically couple at least part of the respective metallization structures of the first and third metallization layers without being electrically coupled to any metallization structures of the second metallization layer, wherein the first metallization layer is a bottommost metallization layer of the semiconductor device and the respective metallization structure of the first metallization layer provides a first power line structure and the third metallization layer is a topmost metallization layer of the semiconductor device and the respective metallization structure of the third metallization layer provides a second power line structure conductively coupled to the first power line structure by the via tower structure.

2. The semiconductor device of claim 1, further comprising:
    a conductive feature in the substrate.

3. The semiconductor device of claim 2, wherein the conductive feature comprises at least one of a source, a drain, and a gate electrode of a transistor.

4. The semiconductor device of claim 2, further comprising:
    a via structure that is formed in an inter-metal dielectric layer, and coupled between conductive feature and the metallization structure of the first metallization layer.

5. The semiconductor device of claim 1, wherein the third metallization layer is a part of a power grid network that is configured to distribute an operation voltage to the semiconductor device.

6. The semiconductor device of claim 1, further comprising:
    one or more additional metallization layers coupled between the first and third metallization layers, wherein each of the one or more additional metallization layers comprises a respective metallization structure formed in a respective dielectric layer.

7. A semiconductor device, comprising:
    first, second, and third metallization layers, on top of one another, that are disposed above a substrate, wherein each of the first, second, and third metallization layers comprises a respective metallization structure formed in a respective dielectric layer, and wherein the first and the third metallization layers are bottommost and topmost metallization layers of the semiconductor device, respectively; and
    a via tower structure formed within a single vertical trench that extends from the first metallization layer to the third metallization layer so as to electrically couple at least part of the respective metallization structures of the first and third metallization layers without being electrically coupled to any metallization structures of the second metallization layer, wherein the first metallization layer is a bottommost metallization layer of the semiconductor device and the respective metallization structure of the first metallization layer provides a first power line structure and the third metallization layer is a topmost metallization layer of the semiconductor device and the respective metallization structure of the third metallization layer provides a second power line structure conductively coupled to the first power line structure by the via tower structure.

8. The semiconductor device of claim 7, further comprising:
a conductive feature in the substrate, wherein the conductive feature comprises at least one of a source, a drain, and a gate electrode of a transistor.

9. The semiconductor device of claim 8, wherein the first metallization layer is coupled to the conductive feature through a via structure in an inter-metal dielectric layer formed between the substrate and the first metallization layer.

10. The semiconductor device of claim 7, wherein the third metallization layer is a part of a power grid network that is configured to distribute an operation voltage to the semiconductor device.

11. The semiconductor device of claim 7, further comprising:
one or more additional metallization layers coupled between the first and third metallization layers, wherein each of the additional metallization layer comprises a respective metallization structure formed in a respective dielectric layer.

12. The semiconductor device of claim 7, wherein each metallization layer comprises a barrier layer formed to surround sidewalls and bottom surface of the respective metallization structure.

13. A semiconductor device, comprising:
first, second, and third metallization layers, on top of one another, that are disposed above a substrate, wherein each of the first, second, and third metallization layers comprises a respective metallization structure formed in a respective dielectric layer, and wherein the second metallization layer is disposed between the first and third metallization layers and the third metallization layer is a part of a power grid network; and
a via tower structure formed within a single vertical trench that extends from the first metallization layer to the third metallization layer so as to electrically couple at least a part of the respective metallization structures of the first and third metallization layers without being electrically coupled to any metallization structures of the second metallization layer, wherein the first metallization layer is a bottommost metallization layer of the semiconductor device and the respective metallization structure of the first metallization layer provides a first power line structure and the third metallization layer is a topmost metallization layer of the semiconductor device and the respective metallization structure of the third metallization layer provides a second power line structure conductively coupled to the first power line structure by the via tower.

14. The semiconductor device of claim 13, wherein the power grid network is configured to distribute an operation voltage to the semiconductor device.

15. The semiconductor device of claim 13, further comprising:
a conductive feature in the substrate, wherein the conductive feature comprises at least one of a source, a drain, and a gate electrode of a transistor, and is coupled the respective metallization structure of the first metallization layer by a via structure.

16. The semiconductor device of claim 13, further comprising:
one or more additional metallization layers coupled between the first and third metallization layers, wherein each of the additional metallization layer comprises a respective metallization structure formed in a respective dielectric layer.

* * * * *